(12) United States Patent
Kiel et al.

(10) Patent No.: US 10,950,513 B2
(45) Date of Patent: Mar. 16, 2021

(54) METHOD FOR INTEGRATING POWER CHIPS AND POWER ELECTRONICS MODULES

(71) Applicants: INSTITUT VEDECOM, Versailles (FR); ELVIA PCB, Coutances (FR)

(72) Inventors: Friedbald Kiel, Fontainebleau (FR); Olivier Belnoue, Ondreville-sur-Essonne (FR)

(73) Assignees: INSTITUT VEDECOM, Versailles (FR); ELVIA PCB, Coutances (FR)

(*) Notice: Subject to any disclaimer, the term of this patent is extended or adjusted under 35 U.S.C. 154(b) by 0 days.

(21) Appl. No.: 16/468,262

(22) PCT Filed: Dec. 5, 2017

(86) PCT No.: PCT/FR2017/053401
§ 371 (c)(1),
(2) Date: Jun. 10, 2019

(87) PCT Pub. No.: WO2018/109317
PCT Pub. Date: Jun. 21, 2018

(65) Prior Publication Data
US 2019/0333833 A1  Oct. 31, 2019

(30) Foreign Application Priority Data
Dec. 12, 2016 (FR) ..................... 1662333

(51) Int. Cl.
*H01L 23/31* (2006.01)
*H01L 23/367* (2006.01)
(Continued)

(52) U.S. Cl.
CPC ...... *H01L 23/3114* (2013.01); *H01L 23/3121* (2013.01); *H01L 23/367* (2013.01);
(Continued)

(58) Field of Classification Search
CPC ............ H01L 23/3114; H01L 23/3121; H01L 23/367; H01L 23/3755; H01L 23/488;
(Continued)

(56) References Cited

U.S. PATENT DOCUMENTS

| 10,734,368 | B2* | 8/2020 | Kiel | H01L 25/117 |
| 2005/0112798 | A1* | 5/2005 | Bjorbell | H01L 24/82 |
| | | | | 438/106 |
| 2016/0133558 | A1 | 5/2016 | Stahr et al. | |

FOREIGN PATENT DOCUMENTS

DE  102014010373 A1  1/2015

OTHER PUBLICATIONS

International Search Report for PCT/FR2017/053401 dated Mar. 26, 2018.
Written Opinion for PCT/FR2017/053401 dated Mar. 26, 2018.

* cited by examiner

*Primary Examiner* — Dale E Page
*Assistant Examiner* — Quovaunda Jefferson
(74) *Attorney, Agent, or Firm* — Sandberg Phoenix & von Gontard, P.C.

(57) ABSTRACT

The method comprises the steps of 1) producing first and second blanks (EB1, EB2) by laminating insulating and conductive inner layers (PP, CP, E1) on copper plates forming a base (MB1, MB2), at least one electronic chip (MT, MD) being sandwiched between the blanks, said blanks being produced such that their upper lamination surfaces have matching profiles, 2) stacking and fitting the blanks via their matching profiles, and 3) press-fitting the blanks to form a laminated sub-assembly for an integrated power electronics device. The method uses IMS-type techniques.

12 Claims, 5 Drawing Sheets

(51) Int. Cl.
*H01L 23/373* (2006.01)
*H01L 23/488* (2006.01)
*H01L 23/538* (2006.01)
*H01L 23/00* (2006.01)

(52) U.S. Cl.
CPC ........ *H01L 23/3735* (2013.01); *H01L 23/488* (2013.01); *H01L 23/5389* (2013.01); *H01L 24/19* (2013.01); *H01L 24/24* (2013.01); *H01L 24/82* (2013.01)

(58) Field of Classification Search
CPC ..... H01L 23/5389; H01L 24/19; H01L 24/24; H01L 24/82
See application file for complete search history.

METHOD FOR INTEGRATING POWER CHIPS AND POWER ELECTRONICS MODULES

CROSS-REFERENCE TO RELATED APPLICATIONS

This application is the US National Stage under 35 USC § 371 of PCT/FR2017/053401, filed 5 Dec. 2017, which claims priority to French application 1662333 filed on Dec. 12, 2016, the content (text, drawings and claims) of both being incorporated herein by reference.

BACKGROUND

The invention generally relates to the field of power electronics. More specifically, the invention relates to a method for integrating electronic power chips. The invention also relates to electronic power modules obtained by implementing the aforementioned method.

The desired energy transition to renewable energy sources producing lower $CO_2$ emissions places power electronics at the heart of current technological challenges. Power electronics are present in nearly all activity sectors, such as transportation, industry, lighting, heating, etc.

For example, in the transportation field, the automotive industry is subject to very restrictive emissions standards, which are leading to real technological change with vehicle electrification. Vehicle electrification, which faces the major weight, bulk and cost constraints that prevail in this mass production industry, requires technological advances in methods for integrating power electronics chips.

In the current state of the art, so-called HDI (High Density Interconnect) technology is typically used to increase the level of integration and reduce the size of power modules. The HDI technology generally implemented on printed circuit boards (PCB) uses an optimization of the spatial implantation of components in particular by using tapes and thinner ceramic interconnect cables and interconnecting micro-holes called "microvias." Laser drilling is used as well as different welding techniques, for example brazing, transitional liquid phase (TLP) welding or metal nanoparticle powder sintering.

It is also known to stack printed circuit boards to produce 3D architectures. Thus, DE102014010373A1 proposes an electronic module having first and second printed circuit boards that are superimposed and each include an electronic component. A sintering method is used to bond the boards together. Furthermore, US2016/133558A1 describes a power module comprising a central printed circuit board that is sandwiched between two heat sink plates. Electronic components are implanted in the central board.

HDI technology encounters its limitations when faced with the cost reductions that are necessary for mass production, and the increased level of integration and compactness. Indeed, certain techniques that are used, such as laser drilling, do not facilitate the parallelization of manufacturing processes and hinder cost reductions.

The level of integration that can be obtained is limited by the space occupied by the interconnections with tapes and microvias. These interconnections with tapes or cables introduce stray inductances that oppose one another at higher cutoff or switching frequencies. Reducing stray inductances is necessary to reduce the generated heat and protect the circuit from potentially destructive overvoltages. Yet increasing switching frequencies is favorable to compactness, in particular in power converters.

The increased level of integration and the compactness of electronic power modules accentuates the heat constraints on the components. High-performing cooling is necessary to keep the junction temperatures of the active components below critical values, achieve thermal equilibrium and guarantee the reliability of the power modules. To that end, the architecture of the power modules and the technologies used must allow the dissipated energy to be extracted as close as possible to the components.

Today, it appears desirable to offer a new technology allowing an increased level of integration of the electronic power modules and that is suitable for mass production.

SUMMARY

According to a first aspect, a method is disclosed for integrating electronic power chips for producing a laminated subassembly intended for an integrated electronic power device. The method comprises:
producing first and second blanks, each of the blanks being made by laminating insulating and conductive inner layers on a plate forming a metal base, at least one electronic chip being implanted in one or the other of the first and second blanks, and the first and second blanks being made such that their upper lamination surfaces have matching profiles;
stacking and fitting the first and second blanks via their upper surfaces with matching profiles; and
press-fitting the first and second blanks in order to produce the laminated subassembly intended for the integrated electronic power device, the assembly comprising maintaining pressure until finalization of the mechanical bonds by resin polymerization and of the electrical bonds between the at least one electronic chip, the metal base-forming plates and the conductive inner layers.

According to one particular feature of the method, the lamination of the insulating and conductive inner layers of the first and second blanks is done on a copper metal base-forming plate.

According to another particular feature, the laminated insulating and conductive inner layers are formed using IMS-type techniques.

According to still another particular feature, the metal base-forming plates are profiled mechanically and/or by photolithography.

According to still another particular feature, during the production of the first and second blanks, stage B prepreg dielectric portions are produced from a stage B prepreg sheet by forging with a hollow punch and/or cutting with a milling cutter and/or blade and are implanted in respective locations of the blanks.

According to still another particular feature, during the production of the first and second blanks, conductive portions are made from a sheet of copper by forging with a hollow punch and/or cutting with a milling cutter and/or blade and are implanted in respective locations of the blanks.

According to still another particular feature, during the production of the first and second blanks, the conductive portions are laminated in their respective locations by vacuum pressing and/or by passing through a vacuum lamination furnace.

According to still another particular feature, during the production of the first and second blanks, dielectric and conductive portions are made from a copper-coated laminate by forging with a hollow punch and/or cutting with a milling cutter and/or blade, and are implanted in respective locations of the blanks and laminated by vacuum pressing and/or by passing in a vacuum lamination furnace.

According to still another particular feature, during the production of the first and second blanks, the formation of the inner layers incorporates a precise definition of connection patterns by photolithography.

According to still another particular feature, during the production of the first and second blanks, the formation of the inner layers includes an electrodeposition of a metal layer.

According to still another particular feature, during the production of the first and second blanks, the formation of the inner layers includes a deposition of an electrical interconnection material in determined locations including locations dedicated to the at least one electronic chip, the deposition being done by electrolysis and/or solder paste screen printing and/or using a solder paste distributor.

According to another particular feature, the press-fitting of the first and second blanks includes a vacuum pressing and/or a passage in the vacuum lamination furnace.

According to another aspect, an integrated electronic power device in the form of an electronic power module is disclosed, the device comprising first and second laminated subassemblies made by carrying out the method as briefly described above and a central cooling liquid circulation space arranged between the first and second subassemblies, the first and second laminated subassemblies being superimposed and bonded together and respectively comprising first and second electronic power switches forming a bridge arm.

According to one particular feature, the electronic power switches are MOSFET- or IGBT-type transistors.

DESCRIPTION OF THE FIGURES

Other features and advantages of the present invention will appear more clearly upon reading the detailed description below of several particular embodiments of the invention, in reference to the appended drawings, in which.

DETAILED DESCRIPTION

One particular embodiment of the method is now described below in the context of producing a power module in the form of a transistor switching bridge, or half-bridge, arm.

Figure 1A:
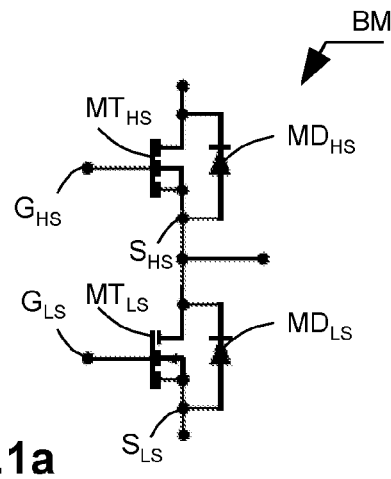
FIGS. 1a and 1b show two diagrams of transistor bridge arms, with MOSFET transistors and IGBT transistors.
Figure 1B:
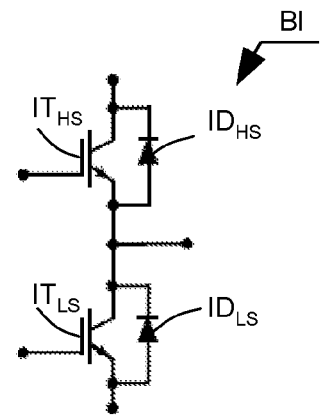

Two examples of power modules are shown in FIGS. 1a and 1b. These modules can be associated to form complete switching bridges or combined in parallel to pass the desired current.

As shown in FIGS. 1a and 1b, these power modules are formed by a transistor switching bridge, or half-bridge, arm. The bridge arm conventionally comprises a high side transistor and a low side transistor, and associated diodes. FIG. 1a shows a diagram of a first bridge arm BM made up of MOSFET transistors, $MT_{HS}$ and $MT_{LS}$, and diodes $MD_{HS}$ and $MD_{LS}$ respectively associated with the transistors. FIG. 1b shows a diagram of a second bridge arm BI made up of IGBT transistors, $IT_{HS}$ and $IT_{LS}$, and their associated diodes $ID_{HS}$ and $ID_{LS}$.

In the description below, the manufactured power module is considered to be a bridge arm BM as shown in FIG. 1a, i.e., comprising two MOSFET transistors, $MT_{HS}$ and $MT_{LS}$, and diodes $MD_{HS}$ and $MD_{LS}$ respectively associated with the transistors. In some configurations, the diodes associated with the transistors will already be integrated into the chips of the transistors, such that their implantations will not be necessary. It will be noted that the manufactured power module and the bridge arm both have a same reference BM below. It will also be noted that this description also applies to the bridge arm BI of FIG. 1b by replacing the MOSFET transistors with IGBT transistors.

In general, the method uses power electronics manufacturing techniques that are well known and mastered and that are essentially derived from IMS (Insulated Metal Substrate) technology. Thus, in the method, it is possible to use a combination of different manufacturing techniques comprising lamination, photolithography, metal electrodeposition, wet etching and others. For the welding of the components, it is possible to use transitional liquid phase (TLP) welding, metal nanoparticle powder sintering or diffusion welding. Forging with a hollow punch will also be used to cut elements to be attached in the blank of the module being manufactured out of films or sheets of insulation and copper. Tools for positioning and holding in position will also be used during attachment operations on the blank.

Also in reference to FIGS. 2 to 9, a detailed description will now be provided of the different manufacturing steps occurring in the method for integrating electronic power chips. These steps make it possible to produce laminated inner layers present in a power module and a general sandwich architecture.

Figure 2:
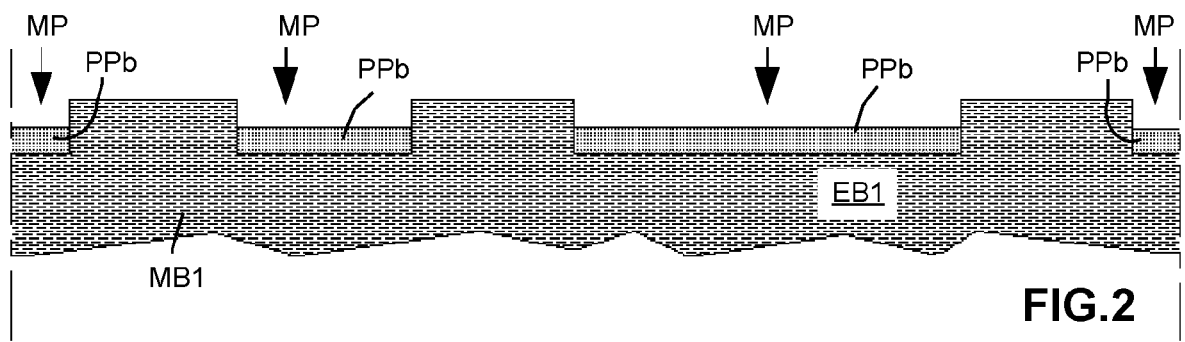
FIGS. 2 to 9 are simplified sectional views showing steps of the method for integrating electronic chips.

FIG. 2 shows a blank EB1, in an initial stage, of a subassembly of a power module.

In the initial manufacturing step of FIG. 2, stage B prepreg dielectric portions PPb are deposited on a metal base-forming plate MB1 in respective locations MP thereof. If necessary, positioning means are used for the placement of the dielectric portions PPb in their respective locations MP.

The stage B prepreg dielectric portions PPb here are typically woven fiberglass dielectrics coated with an epoxy-type resin and partially polymerized. Other dielectrics such as Teflon® or polyimide can, however, be used for special applications. The dielectric portions PPb can be obtained by forging with a hollow punch of a sheet of stage B prepreg, or by cutting with a milling cutter and/or blade.

The metal base MB1 is preferably made from copper. As shown in FIG. 2, the metal base MB1 is profiled beforehand so as to form the locations MP. The prior profile of the metal base MB1 is typically obtained by mechanical removal of material or by photolithography.

Figure 3:
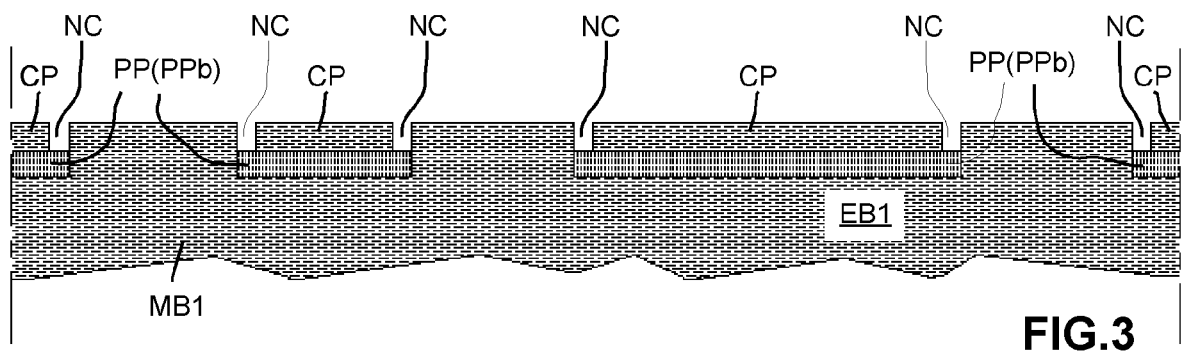

In the steps shown in FIG. 3, the dielectric portions PPb are partially covered with conductive copper portions CP. Positioning means are used if necessary to attach the conductive portions CP on the dielectric portions PPb. Parts NC not covered by the conductive portions CP are left at side walls of the locations MP.

The conductive portions CP are obtained from a copper sheet by forging with a hollow punch or by cutting with a milling cutter or blade. The lamination of the layers of the portions PPb and CP on the metal base MB1 is obtained by vacuum pressing or passing in the vacuum lamination furnace. The dielectric portions PPb are shown in FIG. 3 in their polymerized form in a dielectric layer PP.

In a variant, it will be noted that it is possible to obtain the laminated blank EB1 of FIG. 3 from a copper-clad laminate CCL. The laminate portions formed by a dielectric layer and a copper cladding are cut out of a laminate panel and attached in the locations MP that can, if necessary, be coated beforehand with resin. The lamination of the laminate portions on the metal base MB1 is obtained by vacuum pressing or passing in the vacuum lamination furnace.

Figure 4:
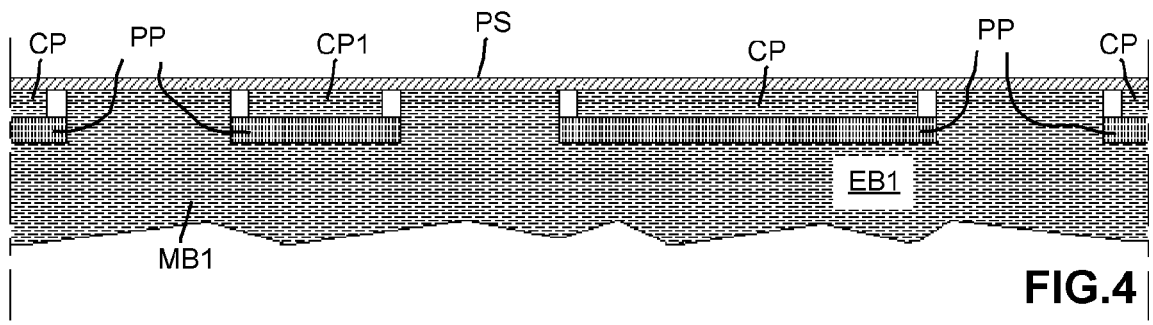
Figure 5:
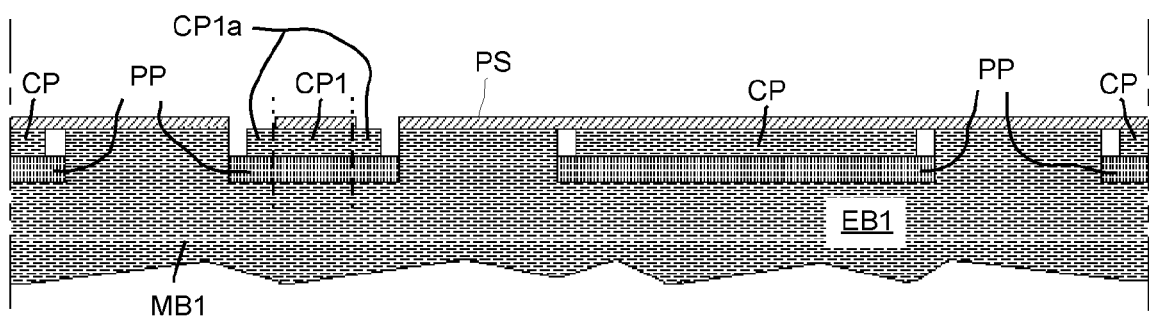

The steps of FIGS. 4 and 5 show a photolithography operation intended to define the copper connection patterns with a high precision. The adjustment of the width of a conductive portion CP1 is shown in these figures as an example.

In FIG. 4, a photoresist resin PS is coated on the upper laminating surface of the blank EB1. The surface parts to be etched by wet etching are next defined and cleared conventionally by using a screen printing mask and exposure to ultraviolet radiation.

In FIG. 5, the blank EB1 is ready for wet etching of the copper. Metal portions CP1a are removed and the connection pattern is thus made with precision.

Figure 6:
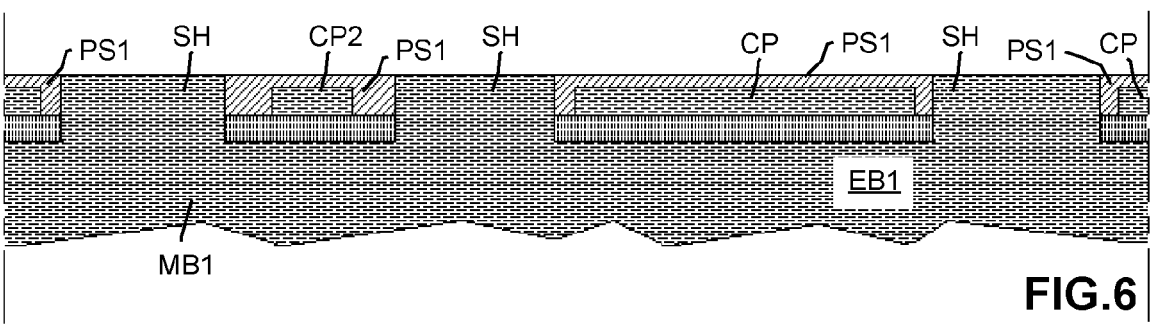

The step of FIG. 6 is a metal electrodeposition intended to planarize the upper copper connection surfaces SH of the blank EB1.

As shown in FIG. 6, a masking photoresist resin PS1 is deposited to fill the cavities. The metal electrodeposition is next done and planarizes the upper connection surfaces SH. The electrodeposited metal planarization layer can be copper, tin or another appropriate metal, depending on the application. The masking photoresist resin PS1 is next removed using known methods such as an oxygen plasma treatment, dry stripping or stripping with solvent.

Figure 7:
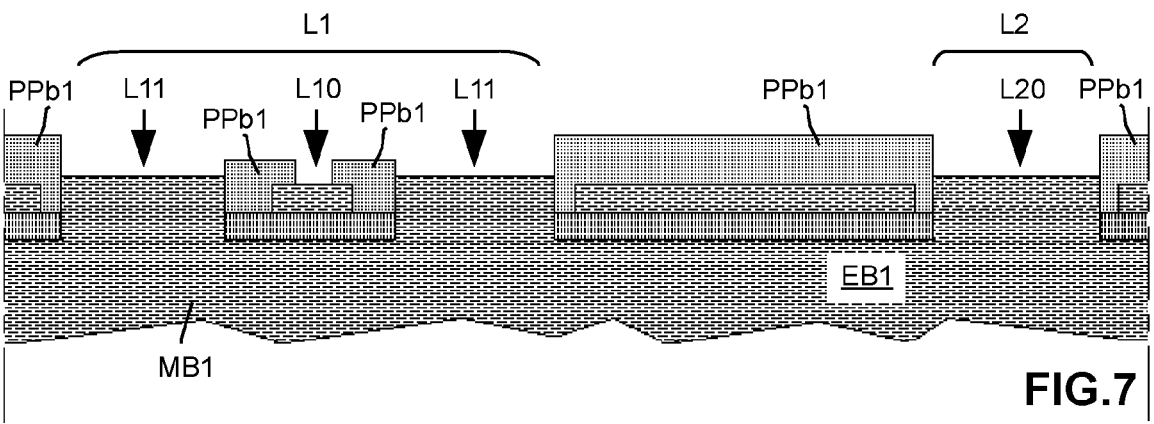

In the step of FIG. 7, stage B prepreg dielectric portions PPb1 are deposited, if necessary in several layers, on superficial parts of the blank EB1. This step makes it possible to configure the cavities and the electrical insulation parts necessary for the deposition of the electrical interconnection material and the implantation of the electronic chips. The dielectric portions PPb1 are obtained and implanted similarly to the portions PPb of FIG. 2.

As shown in FIG. 7, in this exemplary embodiment, the locations L1 and L2 are shaped in this step to receive the chip of a transistor MT and the chip of a diode MD, respectively.

The location L1 includes cavities L10 and L11 intended for the electrical interconnection material. The cavity L10 is provided for the electrical contact between the conductive portions CP2 and a gate electrode ($G_{HS}$ or $G_{LS}$ in FIG. 1a) of the transistor MT. The cavity L11 is provided for the electrical contact between the base plate MB1 and a drain electrode ($D_{HS}$ or $D_{LS}$ in FIG. 1a) of the transistor MT.

The location L2 includes a cavity L20 intended for the electrical interconnection material. The cavity L20 is provided for the electrical contact between the base plate MB1 and a cathode electrode (FIG. 1a) of the diode MD.

Figure 8:
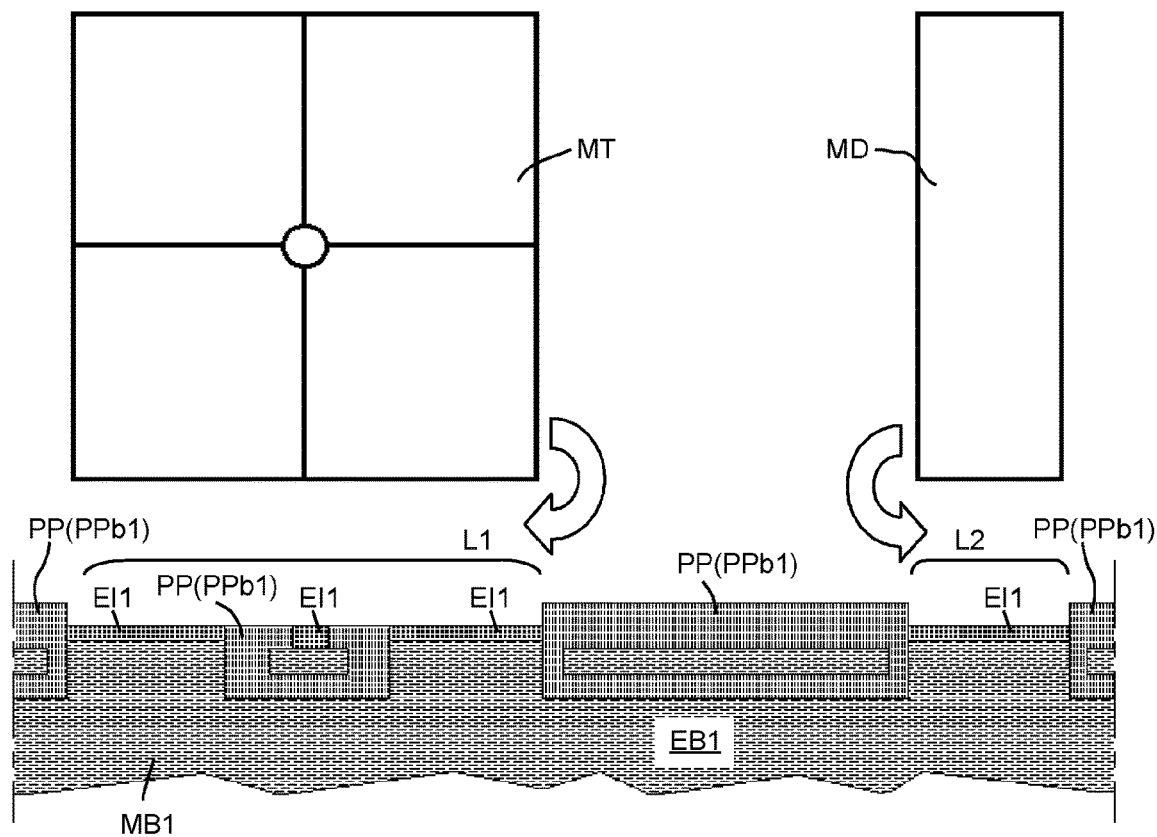

In the step of FIG. 8, the chips of the components MT and MD are placed in the locations L1 and L2 of the blank EB1.

In FIG. 8, the stage B prepreg dielectric portions PPb1 are shown as being completely polymerized and forming dielectric layers PP. It will be noted, however, that this manufacturing step can be done while the portions PPb1 are not yet fully polymerized.

As shown in FIG. 8, the electrical interconnection material E11 is deposited in the cavities L10, L11 of the location L1 and the cavity L20 of the location L2. The deposition of the electrical interconnection material E11 can be used by electrolysis, solder paste screen printing or using a solder paste distributor.

Figure 9:
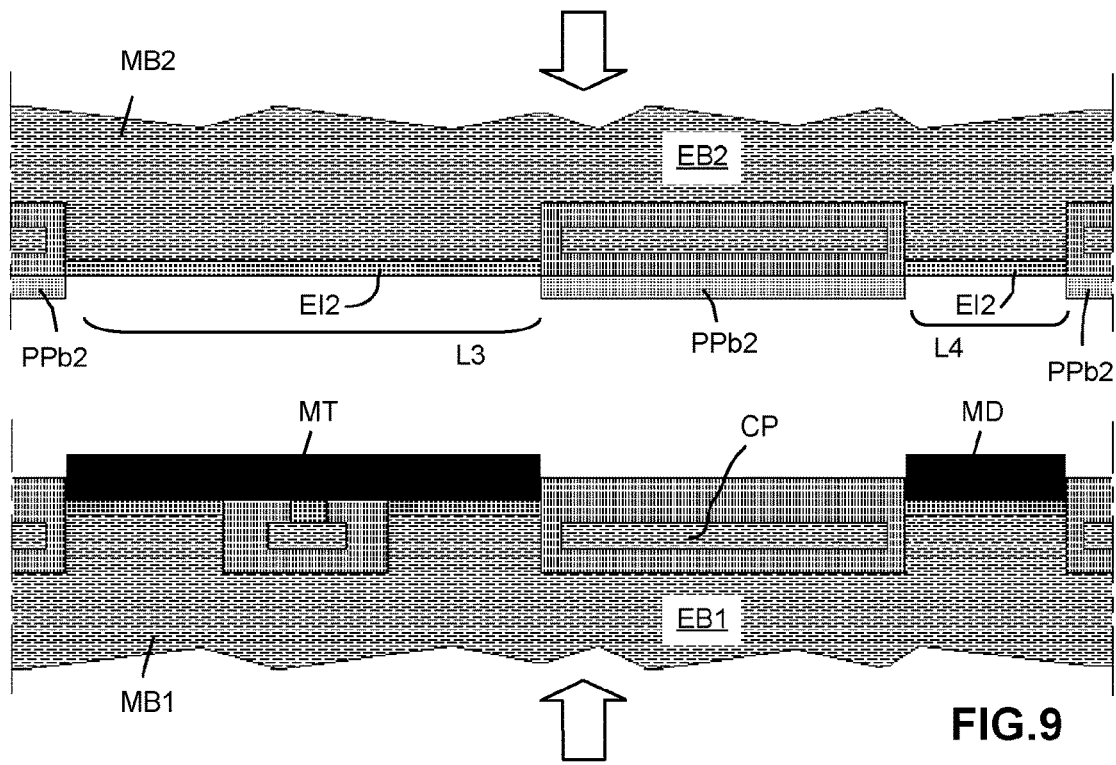

FIG. 9 shows the assembly of the blank EB1, obtained by the manufacturing steps of FIGS. 2 to 8, and a matching blank EB2. The blank EB2 is made according to manufacturing steps similar to those of the blank EB1. It will be noted that the blanks EB1 and EB2 are preferably manufactured in parallel on different manufacturing lines, which allows a significant decrease in the manufacturing time.

As shown in FIG. 9, the upper lamination surface profile of the blank EB2 matches and marries that of the blank EB1.

The blank EB2 includes locations L3 and L4 that respectively match the locations L1 and L2 of the blank EB1. The surfaces of the locations L1 and L2 are covered with an electrical interconnection material E12, identical to the material E11 of the substrate EB1, for the electrical connection of a source electrode ($S_{HS}$ or $S_{LS}$ in FIG. 1a) and an anode electrode (FIG. 1a) of the transistor MT and diode MD chips to a metal base-forming plate BM2 of the blank EB2, respectively.

The blank EB2 comprises stage B prepreg dielectric portions PPb2 that are arranged matching the dielectric portions PP(PPb1) of the blank EB1.

As shown in FIG. 9, the blanks EB1 and EB2 are pressed against each other and capture the chips of the components MT and MD in their inner layers. The final assembly and the obtaining of the laminated subassembly are done by vacuum pressing or passing in the vacuum lamination furnace. The final polymerization of the dielectric portions and their bonds with the electrical interconnection material occur during this final assembly.

The method, as described above in reference to FIGS. 2 to 9, allows the production of power subassemblies or of complete electronic power devices with a laminated sandwich architecture. Compared to the other known technologies, such as the HDI technology, the method proposed here simultaneously allows an increased performance, increased compactness and cost reductions provided by shorter manufacturing times and the use of proven and cost-effective techniques of the IMS type. The optimization of the internal connector technology of the subassemblies, made without vias or microvias, in particular allows a reduction in stray inductances and better integration. The sandwich architecture with two copper plates (MB1, MB2), which are close and arranged on either side of the electronic components, greatly facilitates the discharge of the dissipated heat, due to the masses of copper with a high heat conductivity present on either side of the components.

Figure 10:
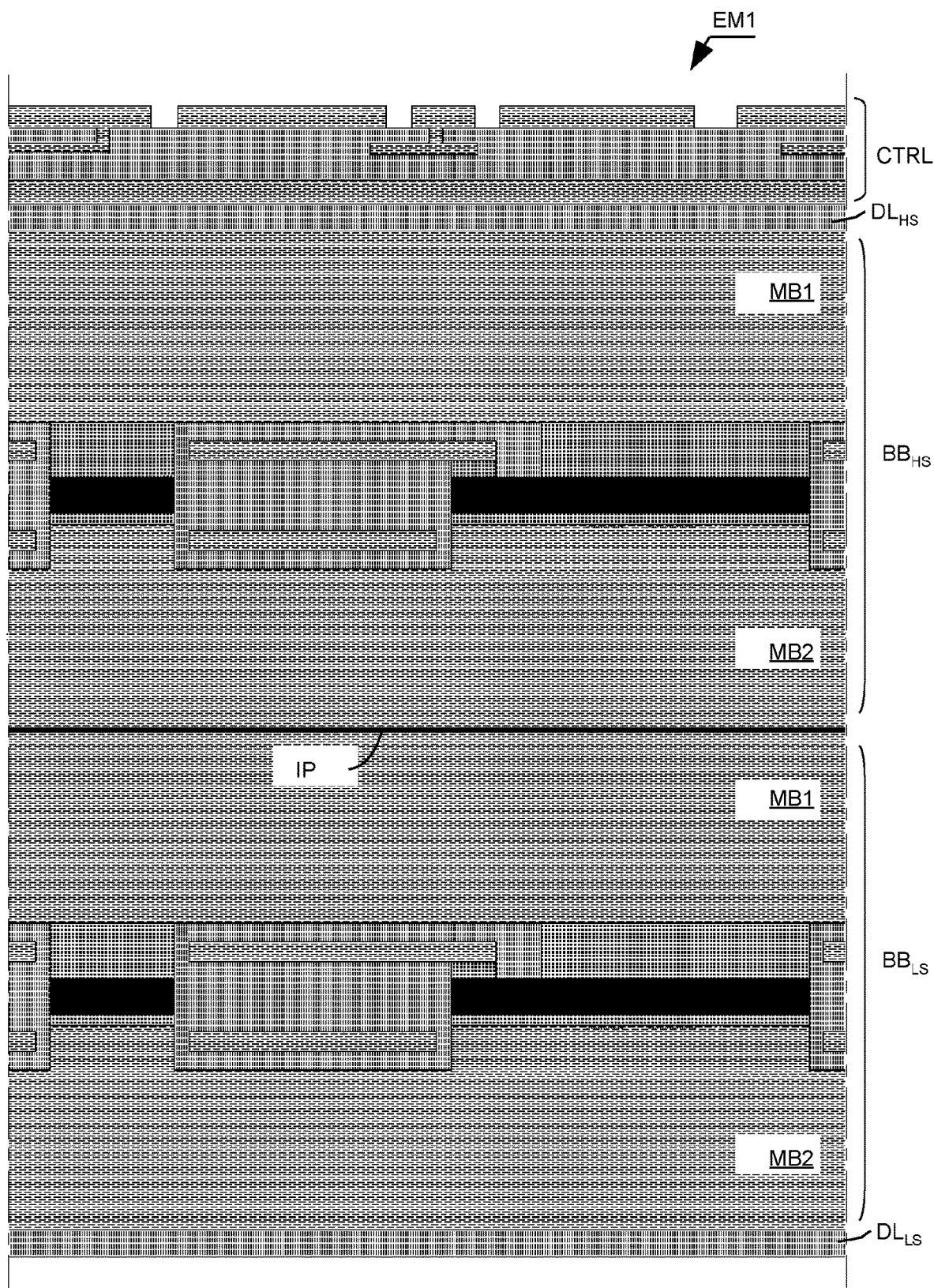
FIGS. 10 and 11 are simplified sectional views showing first and second embodiments of a power module, for an air-cooled module and a liquid-cooled module.
Figure 11:
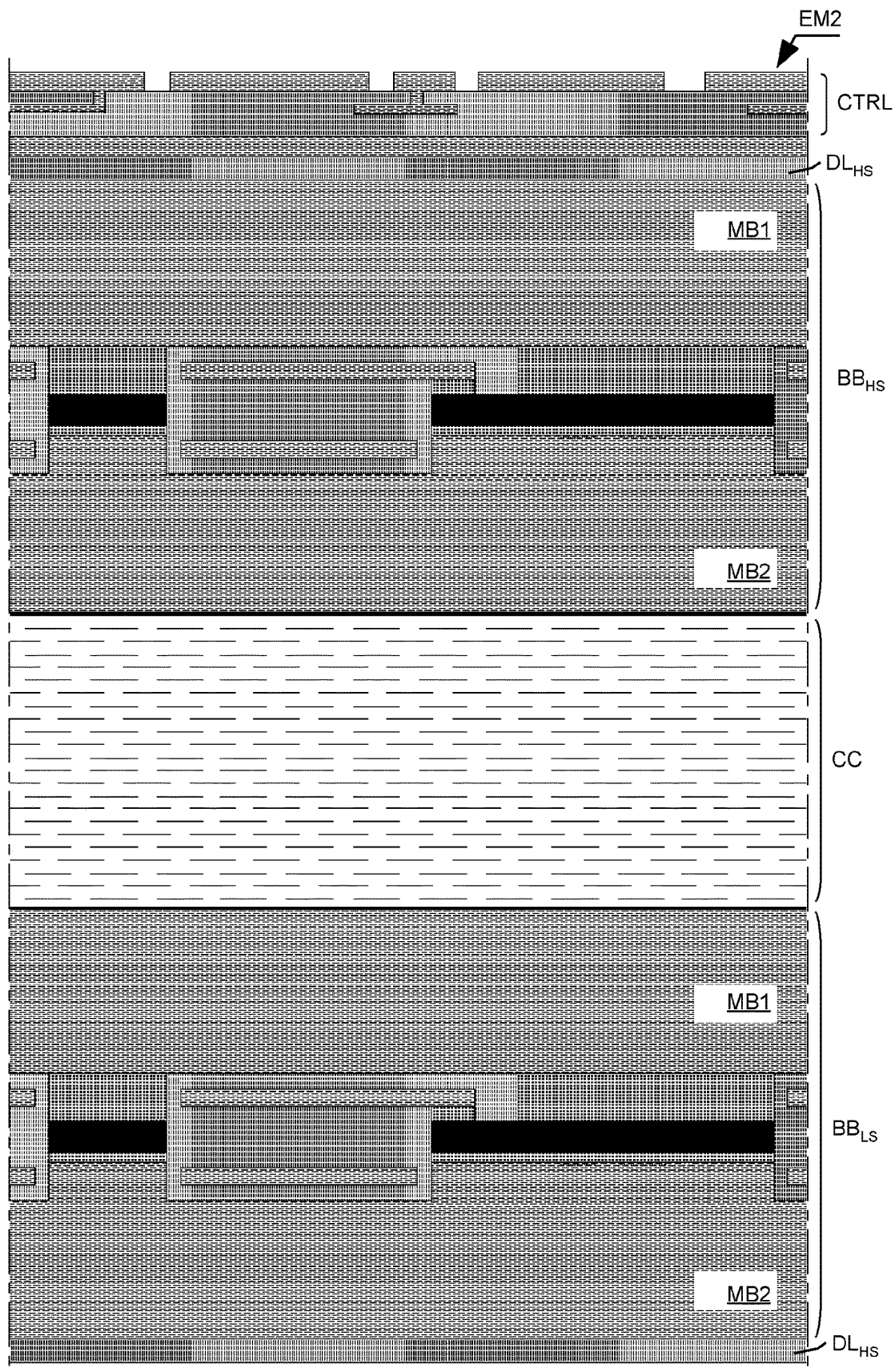

In reference to FIGS. 10 and 11, there are now described first and second embodiments EM1 and EM2 of a power module in the form of a bridge arm as shown in FIGS. 1a and 1b.

These power modules EM1 and EM2 are built by stacking two laminated subassemblies $BB_{HS}$ and $BB_{LS}$ manufactured similarly to that described above in reference to FIGS. 2 to 9.

In general, it will be noted that the laminated subassemblies are elementary components that can be assembled to make up more or less complex integrated electronic power devices. The assembly of two stacked elementary components is typically done by press-fitting and passing in a furnace. The mechanical and electrical connections between the two components will be provided by welding.

The module EM1 shown in FIG. 10 is an air-cooled embodiment. The converter formed by the assembly of several power modules EM1 can, if necessary, be equipped with heat sink means. The heat sink means will comprise one or several electrically insulated radiators in thermal contact with the copper parts MB1, MB2. The architecture allows an effective extraction of the dissipated heat with conventional radiators, thus avoiding the use, in a certain number of applications, of more costly means such as phase change cooling devices.

The mechanical and electrical bond at the junction plane IP between the components $BB_{LS}$ and $BB_{HS}$ of FIG. 10 can be obtained by transitional liquid phase (TLP) welding, bonding by sintering or by other welding techniques indicated above.

As shown in FIG. 10, the module EM1 is equipped here with a control circuit CTRL that is arranged in the upper part of the module and that is electrically insulated, by a dielectric layer $DL_{HS}$, from the copper part MB1 of the component $BB_{HS}$. A dielectric layer $DL_{LS}$ is arranged in the lower part of the module and provides electrical insulation of this part of the component $BB_{LS}$. The circuit CTRL includes several laminated layers made using the techniques described above. Active and passive components can, if necessary, be embedded between the inner layers of the circuit CTRL, or implanted on the surface on the circuit conventionally by brazing or conductive glue.

The module EM2 shown in FIG. 11 is a liquid-cooled embodiment that is suitable for high-power applications.

Aside from the components $BB_{LS}$ and $BB_{HS}$, the control circuit CTRL arranged on the upper part of the module, and the dielectric layers $DL_{HS}$, and $DL_{HS}$, similarly to the module of FIG. 10, the module EM2 also comprises a cooling liquid circulation space CC. A pressurized dielectric cooling liquid can for example be used as heat transfer liquid. The space CC is provided in the central part of the module EM2, in direct contact with the copper plates MB1 and MB2 of the components $BB_{LS}$ and $BB_{HS}$, respectively.

Other embodiments of power modules are of course possible, such as a module also comprising cooling liquid circulation spaces in the upper and lower parts of the module, for example. The components $BB_{LS}$ and $BB_{HS}$ are then cooled by the cooling liquid circulating on either side of each component $BB_{HS}$, $BB_{LS}$, so as to extract more heat.

The invention is not limited to the specific embodiments that have been described here as an example. Depending on the applications of the invention, one skilled in the art can provide various changes and variants that fall within the scope of the appended claims.

The invention claimed is:

1. A method for integrating electronic power chips for producing a laminated subassembly intended for an integrated electronic power device, the method comprising:
producing first and second blanks, each of said blanks being made by laminating insulating and conductive inner layers on a plate forming a metal base, said insulating layer comprising a resin-containing stage B prepreg dielectric portions, at least one said electronic chip being implanted in one or the other of said first and second blanks, and said first and second blanks being made such that their upper lamination surfaces have matching profiles, the profiles of each of said first and second blanks defining at least one cavity which receive said integrated electronic power device;
stacking and fitting said first and second blanks via their upper surfaces with matching profiles, such that said integrated electronic power device is contained in part the at least one cavity of the first blank and in part by the at least one cavity of the second blank; and
press-fitting the first and second blanks in order to produce a laminated subassembly intended for the integrated electronic power device, said press-fitting step comprising maintaining pressure until finalization of the mechanical bonds by polymerization of the resin of the stage B prepreg dielectric portion and of the electrical bonds between the at least one electronic chip, said metal base-forming plates and said conductive inner layers.

2. The method for integrating electronic power chips according to claim 1, wherein the lamination of the insulating and conductive inner layers of said first and second blanks is done on a copper metal base-forming plate.

3. The method according to claim 1, wherein during the production of said first and second blanks, said laminated insulating and conductive inner layers are formed using IMS-type techniques.

4. The method according to claim 1, wherein during the production of said first and second blanks, said metal base-forming plates are profiled mechanically and/or by photolithography.

5. The method according to claim 1, wherein during the production of said first and second blanks, said stage B prepreg dielectric portions are produced from a stage B prepreg sheet by forging with a hollow punch and/or cutting with a milling cutter and/or blade and are implanted in respective locations of said blanks.

6. The method according to claim 1, wherein during the production of said first and second blanks, conductive portions are made from a sheet of copper by forging with a hollow punch and/or cutting with a milling cutter and/or blade and are implanted in respective locations of said blanks.

7. The method according to claim 6, wherein during the production of said first and second blanks, said conductive portions are laminated in their respective locations by vacuum pressing and/or by passing through a vacuum lamination furnace.

8. The method according to claim 1, wherein during the production of said first and second blanks, dielectric and conductive portions are made from a copper-coated laminate by forging with a hollow punch and/or cutting with a milling cutter and/or blade, and are implanted in respective locations of said blanks and laminated by vacuum pressing and/or by passing in a vacuum lamination furnace.

9. The method according to claim 1, wherein during the production of said first and second blanks, the formation of said inner layers incorporates a precise definition of connection patterns by photolithography.

10. The method according to claim 1, wherein during the production of the first and second blanks, the formation of said inner layers includes an electrodeposition of a metal layer.

11. The method according to claim 1, wherein during the production of said first and second blanks, the formation of said inner layers includes a deposition of an electrical interconnection material in determined locations including locations dedicated to the at least one electronic chip, the deposition being done by electrolysis and/or solder paste screen printing and/or using a solder paste distributer.

12. The method according to claim 1, wherein the press-fitting of said first and second blanks includes a vacuum pressing and/or a passage in the vacuum lamination furnace.

* * * * *